US010620063B2

(12) United States Patent
Sun et al.

(10) Patent No.: US 10,620,063 B2
(45) Date of Patent: Apr. 14, 2020

(54) MULTIFUNCTIONAL PIEZOELECTRIC LOAD SENSOR ASSEMBLY

(71) Applicant: Sikorsky Aircraft Corporation, Stratford, CT (US)

(72) Inventors: Fanping Sun, Glastonbury, CT (US); Zaffir A. Chaudhry, Glastonbury, CT (US); Avinash Sarlashkar, Jr., Pittsford, NY (US)

(73) Assignee: SIKORSKY AIRCRAFT CORPORATION, Stratford, CT (US)

( * ) Notice: Subject to any disclaimer, the term of this patent is extended or adjusted under 35 U.S.C. 154(b) by 0 days.

(21) Appl. No.: 15/747,691

(22) PCT Filed: May 31, 2016

(86) PCT No.: PCT/US2016/035003
§ 371 (c)(1),
(2) Date: Jan. 25, 2018

(87) PCT Pub. No.: WO2017/023404
PCT Pub. Date: Feb. 9, 2017

(65) Prior Publication Data
US 2018/0217014 A1  Aug. 2, 2018

Related U.S. Application Data

(60) Provisional application No. 62/199,405, filed on Jul. 31, 2015.

(51) Int. Cl.
*G01L 1/16* (2006.01)
*G01M 5/00* (2006.01)
(Continued)

(52) U.S. Cl.
CPC ............. *G01L 1/162* (2013.01); *G01H 11/08* (2013.01); *G01M 5/0033* (2013.01); *G01M 5/0083* (2013.01); *H01L 41/1132* (2013.01)

(58) Field of Classification Search
CPC ........... G01L 9/00; G01L 1/162; G01H 11/08; G01M 5/0033; G01M 5/0083; H01L 41/1132
(Continued)

(56) References Cited

U.S. PATENT DOCUMENTS 3,153,338 A  10/1964  Kleesattel
5,220,836 A   6/1993  Harms et al.
(Continued)

FOREIGN PATENT DOCUMENTS

EP   0318152 A2    5/1989
JP   60222734 A   11/1985
WO   200052440 A1  9/2000

OTHER PUBLICATIONS

PCT International Search Report and Written Opinion; International Application No. PCT/US16/35003; International Filing Date: May 31, 2016; dated Oct. 17, 2016; pp. 1-39.
(Continued)

*Primary Examiner* — Octavia Hollington
(74) *Attorney, Agent, or Firm* — Cantor Colburn LLP

(57) ABSTRACT

A piezoelectric sensor assembly for measuring a force quantity on a structure includes at least one piezoelectric sensor, each including an element and two electrodes each projecting outward from the element. An electronic processor of the assembly is configured to receive data from the sensor, wherein the data includes a voltage with a magnitude that is indicative of a dynamic load (i.e., amplitude modulation mode) placed upon the structure. The processor may be configured to interrogate the piezoelectric sensor for its resonant frequency change which is indicative of the load applied to the structure at low operation frequency and to which the piezoelectric sensor would not otherwise respond well. The dual mode operation of the piezoelectric sensor
(Continued)

extends the frequency range of the strain measurement from the dynamic range to static or quasi-static range.

12 Claims, 8 Drawing Sheets

(51) Int. Cl.
*G01H 11/08* (2006.01)
*H01L 41/113* (2006.01)

(58) Field of Classification Search
USPC .................................................. 73/862.59
See application file for complete search history.

(56) References Cited

U.S. PATENT DOCUMENTS

| | | | |
|---|---|---|---|
| 5,765,046 A | 6/1998 | Watanabe et al. | |
| 6,006,163 A | 12/1999 | Lichtenwalner et al. | |
| 6,252,512 B1* | 6/2001 | Riley | G01L 1/162 340/665 |
| 7,024,315 B2* | 4/2006 | Giurgiutiu | G01N 29/11 702/33 |
| 7,181,972 B2* | 2/2007 | Dasgupta | G01H 9/00 73/705 |
| 8,384,398 B2* | 2/2013 | Laflamme | G01B 7/22 324/658 |
| 8,644,527 B2* | 2/2014 | Fujise | H04R 17/00 381/114 |
| 8,655,606 B2* | 2/2014 | van der Linden | G01M 5/0066 702/42 |
| 8,789,426 B1* | 7/2014 | Pekarek | G01L 1/16 73/777 |
| 9,494,477 B2* | 11/2016 | Wiesbauer | B81B 3/0021 |
| 9,638,588 B2* | 5/2017 | Chaudhry | G01L 1/16 |
| 2007/0089513 A1 | 4/2007 | Rosenau et al. | |
| 2008/0011091 A1* | 1/2008 | Weldon, Jr. | G01L 1/255 73/766 |
| 2011/0113898 A1 | 5/2011 | Sato et al. | |
| 2011/0241704 A1 | 10/2011 | Laflamme et al. | |
| 2012/0133448 A1 | 5/2012 | Gregg et al. | |
| 2012/0235847 A1* | 9/2012 | Viikari | G01S 13/75 342/5 |
| 2012/0286935 A1 | 11/2012 | Huang | |
| 2014/0002111 A1* | 1/2014 | Potyrailo | H05K 1/16 324/655 |
| 2014/0042574 A1 | 2/2014 | Carman et al. | |
| 2014/0216175 A1 | 8/2014 | Schricker et al. | |
| 2014/0224018 A1 | 8/2014 | Whitesides et al. | |

OTHER PUBLICATIONS

European Search Report for Application No. 16833449.8 dated Feb. 26, 2019; 13 pages.

* cited by examiner

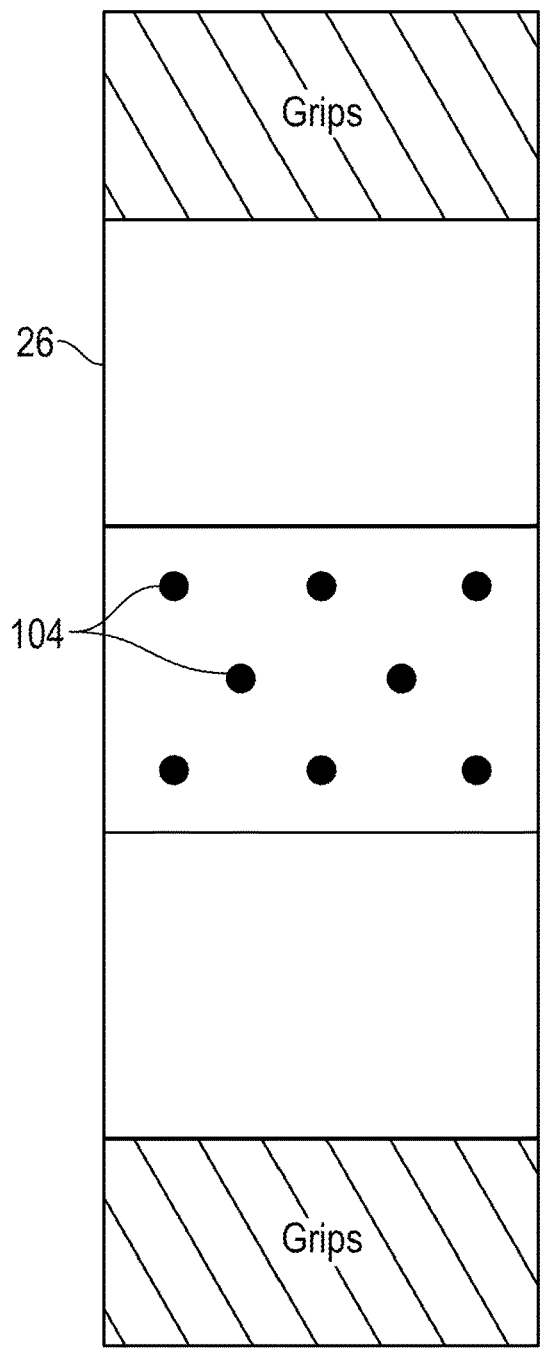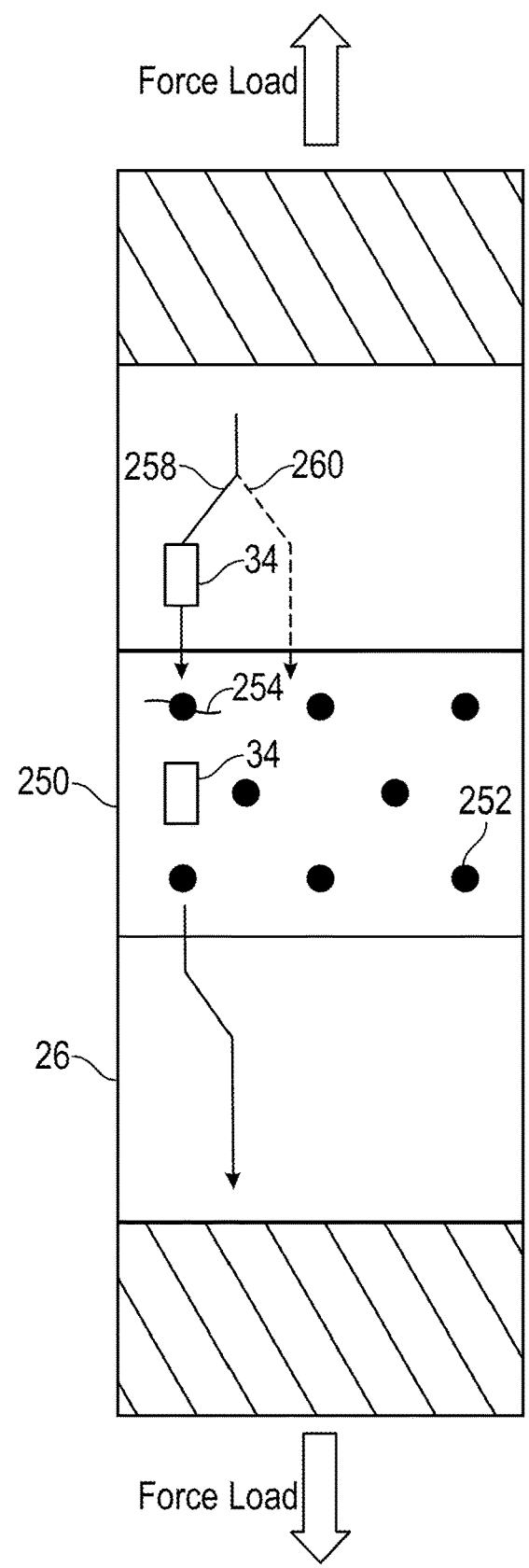
FIG. 8A
FIG. 8B

MULTIFUNCTIONAL PIEZOELECTRIC LOAD SENSOR ASSEMBLY

CROSS-REFERENCE TO RELATED APPLICATIONS

This application is a National Stage application of PCT/US2016/035,003, filed on May 31, 2016, which claims priority from U.S. Provisional Application Ser. No. 62/199,405, filed, Jul. 31, 2015, the contents of which are incorporated by reference in their entirety herein.

STATEMENT REGARDING FEDERALLY SPONSORED RESEARCH AND DEVELOPMENT

This invention was made with government support with the United States Army under Contract No. W911W6-13-2-0006. The government therefore has certain rights in this invention.

BACKGROUND

The subject matter disclosed herein relates generally to load sensors, and more particularly to piezoelectric load sensor assemblies.

Piezoceramic components, such as plates, disks and rings, are known to convert quantities, such as force, pressure, strain, and acceleration, into electrical voltage, or vice-versa, an electrical voltage into mechanical motion. Typical resonant frequencies may be between 200 kHz to 10 MHz.

Piezoelectric sensors are known to be versatile for analog measurement of the quantities such as acceleration and strain. When mechanically strained, the sensor produces an electric charge in proportion to the strain. The charge is then easily measured as a voltage potential difference by a meter. However, the typical finite electric input impedance of the meter makes it a challenge to monitor the static, or slow change voltage as the charge leaks through the input impedance over time, and therefore may disable the measurement of the static or quasi-static strain.

SUMMARY

A piezoelectric sensor assembly for measuring a force quantity on a structure, according to one, non-limiting, embodiment of the present disclosure includes at least one piezoelectric sensor, each including an element and two electrodes each projecting outward from the element; and an electronic processor configured to receive data from the electrodes, wherein the data includes a voltage indicative of a dynamic load placed upon the structure, and wherein the processor is configured to process the data into a force quantity value based on a LRC circuit model.

Additionally to the foregoing embodiment, a tuned and unloaded resonant frequency, and a measured and loaded resonant frequency is associated with the combined element and structure, and a difference between the tuned resonant frequency and the measured resonant frequency is directly proportional to the force quantity value.

In the alternative or additionally thereto, in the foregoing embodiment, the data includes a resonant frequency associated with the combined element and structure that varies with the static load.

In the alternative or additionally thereto, in the foregoing embodiment, the static load includes a load frequency of about less than 3 Hz.

In the alternative or additionally thereto, in the foregoing embodiment, the electronic processor includes a static sensing mode for measuring the static load, and a dynamic sensing mode for measuring a dynamic load.

In the alternative or additionally thereto, in the foregoing embodiment, the data includes a load frequency that is greater than about 3 Hz when the processor is in the dynamic sensing mode.

In the alternative or additionally thereto, in the foregoing embodiment, the piezoelectric sensor assembly is configured to measure the force quantity in a broad load frequency range including a low frequency range associated with the force quantity measured via frequency modulation utilizing the LRC circuit model, and a high frequency range with associated force quantity measured via magnitude-based load monitoring.

A method of operating a piezoelectric sensor assembly for measuring load on a structure according to another, non-limiting, embodiment includes processing data received from a sensor element by a processor in a static sensing mode for loads having a low frequency range; and processing data received from the sensor element by the processor in a dynamic sensing mode for loads having a high frequency range.

Additionally to the foregoing embodiment, the static sensing mode applies an LRC circuit model.

In the alternative or additionally thereto, in the foregoing embodiment, the static sensing mode compares changes in resonant frequency of the sensor element.

In the alternative or additionally thereto, in the foregoing embodiment, the low frequency range is about zero to 3 Hz, and the high frequency range is greater than 3 Hz.

In the alternative or additionally thereto, in the foregoing embodiment, the method includes establishing a baseline resonant frequency associated with the combined sensor element and structure without load.

In the alternative or additionally thereto, in the foregoing embodiment, the method includes measuring a resonant frequency associated with the combined sensor element and structure when loaded; and comparing the measured resonant frequency to the baseline resonant frequency.

In the alternative or additionally thereto, in the foregoing embodiment, the changes in resonant frequency are proportional to the load.

The foregoing features and elements may be combined in various combinations without exclusivity, unless expressly indicated otherwise. These features and elements as well as the operation thereof will become more apparent in light of the following description and the accompanying drawings. However, it should be understood that the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows:

FIG. 8A is a top view of a lap-shear joint of the structure;

FIG. 8B is a top view of the lap-shear joint under loading conditions;

DETAILED DESCRIPTION

Exemplary embodiments of apparatuses, systems, and methods are described for using piezoelectric transducer (PZT) sensors to sense load, in addition to performing a damage detection function. In some embodiments, a monitoring of a structure may be performed in a passive manner, e.g., the monitoring might not require an external or extra source of excitement to be applied to the structure. In some embodiments, joint health may be monitored based on sensor outputs across a joint. In some embodiments, absolute load magnitude monitoring may be provided. In some embodiments, loads may be monitored during one or more states or regimes of operation. In some embodiments, power self-generated by one or more sensors may be collected or aggregated and used to transmit data or information.

In some embodiments, one or more conventional piezoelectric-based damage sensors may be used as load/strain and load-path sensors. Actual operational structural loading may be utilized to produce an easily measurable output proportional to the underlying strain in a structural member. This output, because it is derived from operation-level structural loading such as, e.g., full flight-level loads, may be most sensitive to load path alteration due to damage. Load path direction may also be sensitive to damage, and the sensor can be configured to provide load path information. By comparing two sensor outputs across joints, the joint health can be monitored. Further, the sensors can be used for absolute load magnitude monitoring.

In some embodiments, a large voltage output proportional to a strain in an underlying structure may be obtained without a need for any external excitation. Such an output may be based on a PZT material's intrinsic strain-electric field coupling and the sensor acts as an active strain sensor (the dynamic sensing mode). This alleviates the need for well controlled power supplies and precision sensing-circuits (like a Wheatstone bridge) required for strain-gages. This high sensitivity output also simplifies downstream load/strain path sensing electronics.

Figure 1:
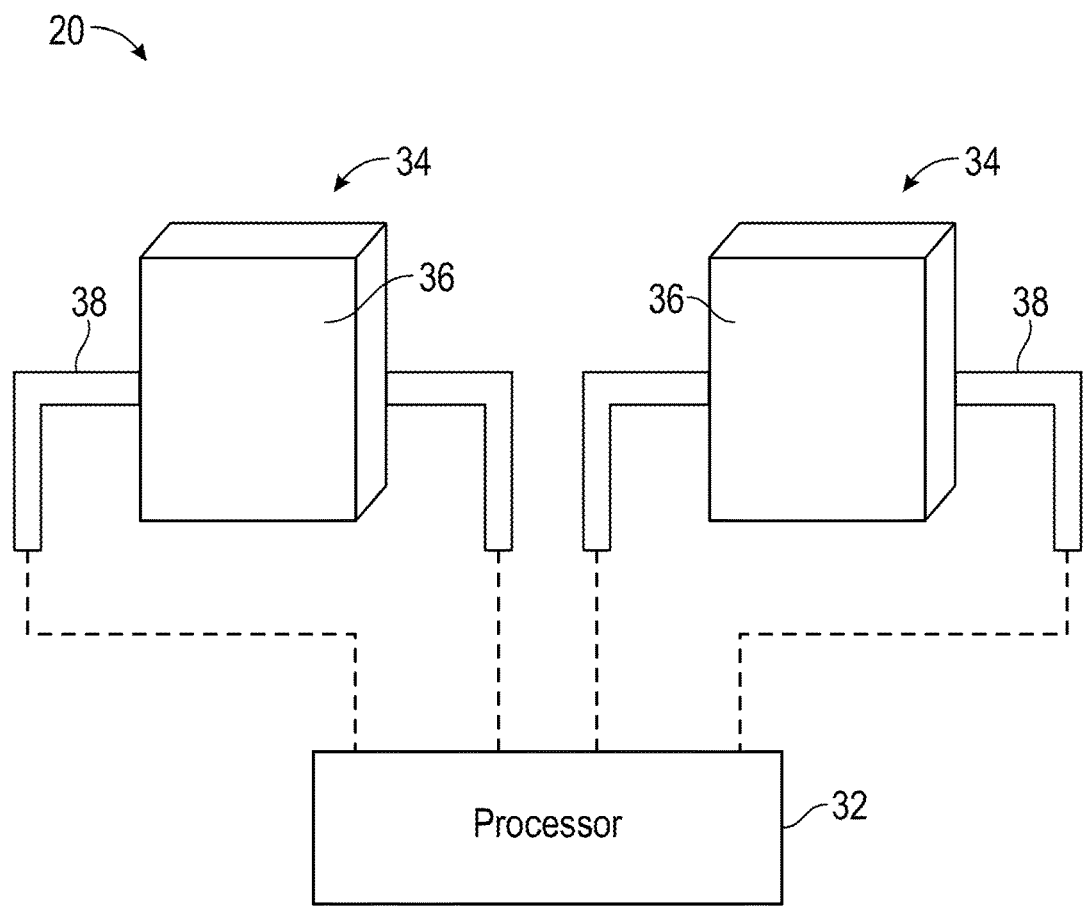
FIG. 1 is a schematic of a piezoelectric sensor assembly according to an exemplary embodiment of the present disclosure.
Figure 2:
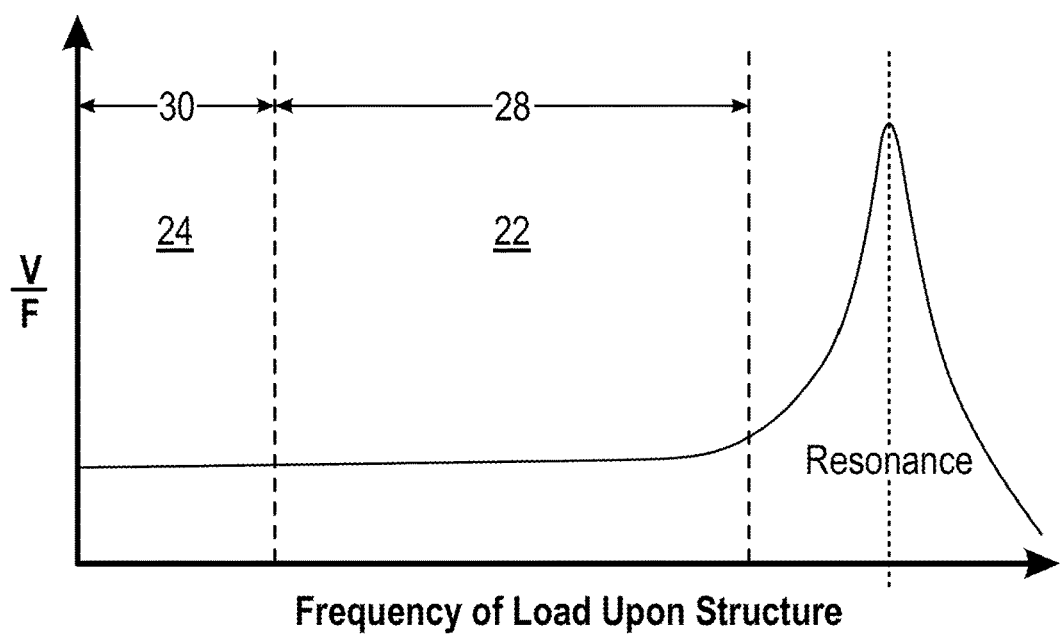
FIG. 2 is a graph depicting resonant frequency of the sensor.
Figure 3:
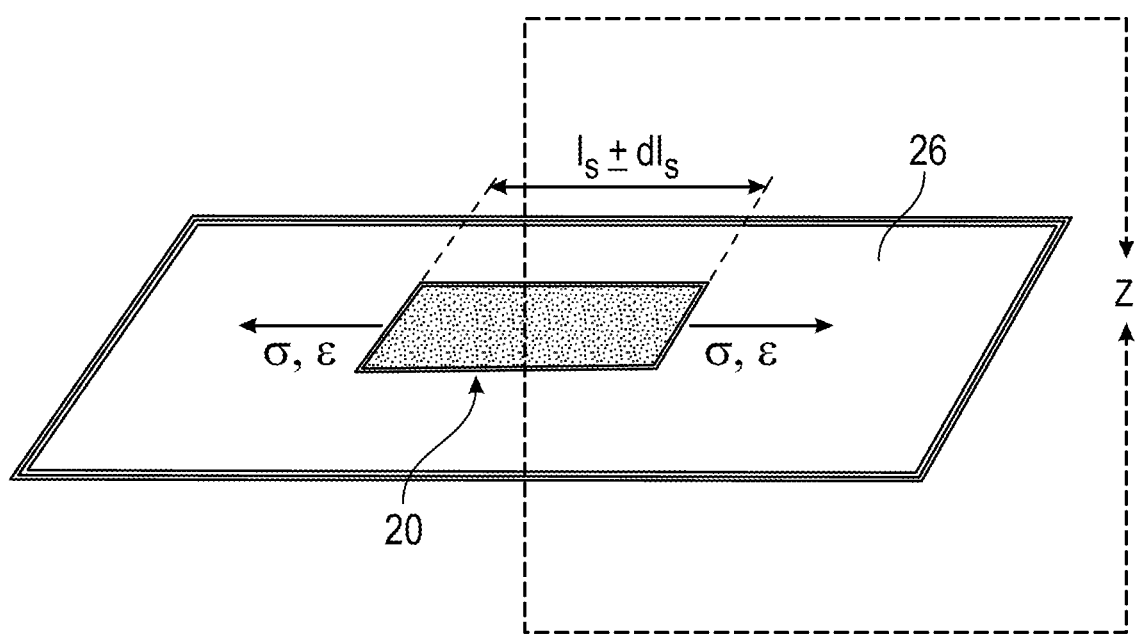
FIG. 3 is a perspective view of the piezoelectric assembly on a structure.

Referring to FIGS. 1 through 3, a multifunctional piezoelectric sensor assembly 20 is illustrated and may be configured with a dynamic sensing mode 22 and a static sensing mode 24 for measuring load placed upon a structure 26 (see FIG. 3). The dynamic sensing mode 22 measures a force quantity (e.g., acceleration, strain, etc.) that is indicative of dynamic or quasi-static loading placed upon a structure and typically over a high frequency range 28 of a loading event upon the structure. The static sensing mode 24 may measure a force quantity that may be indicative of static or steady-state loading placed upon the structure and not generally measureable by more traditional piezoelectric sensing systems. The static loading may be associated with a low frequency range 30 of a static loading event upon the structure.

More specifically, the dynamic sensing mode 22 may generally be an amplitude modulation (AM) mode in which a piezoelectric sensor 34 of the assembly 20 (and without need of external excitation and conditioning) may produce an analog voltage signal with a magnitude proportional to the strain. The output of the sensor 34 in the dynamic sensing mode 22 is the magnitude change. Dynamic sensing mode 22 covers a low frequency to a very high frequency band. In comparison, the static sensing mode 24 may be a frequency modulation (FM) mode in which the sensor 34 is interrogated for a resonant frequency change induced by a load. For static sensing mode 24, the sensor 34 may not actively generate an analog signal as the sensor 34 does in the dynamic sensing mode 22. The output of sensor 34 when in the static sensing mode 24 is a frequency change. Static sensing mode 24 generally enables measurement at a quasi-static to low frequency band.

Figure 4:
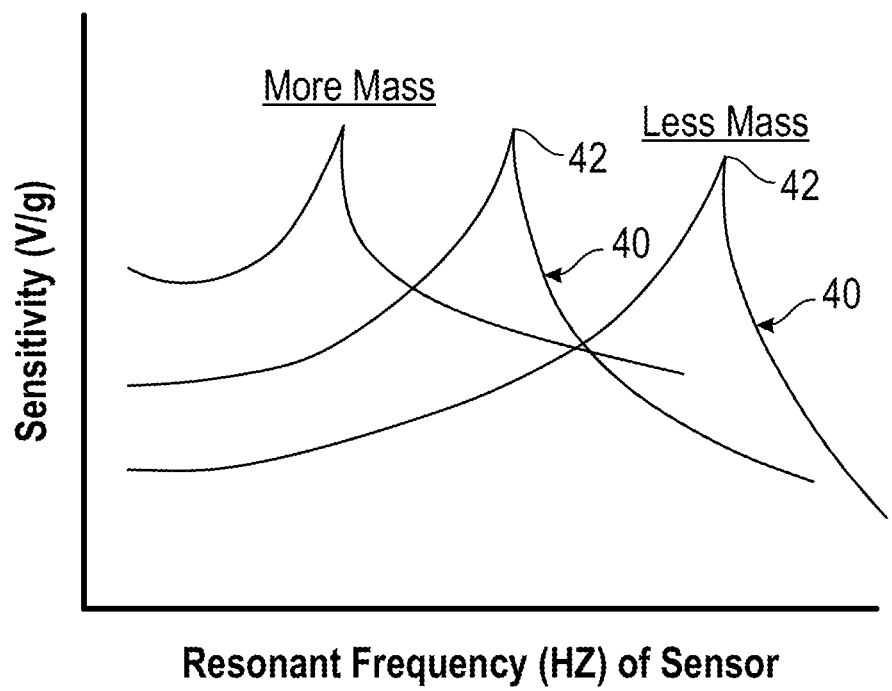
FIG. 4 is a graph depicting resonant frequency changes with the load on structure.

The piezoelectric sensor assembly 20 may include an electronic processor 32 and at least one piezoelectric sensor 34 (two illustrated). Each sensor 34 may include an element 36, and two electrodes or leads 38. Although not illustrated, the processor 32 may include a signal conditioning device, filters, high-input impedance amplifiers, electronic memory, a measurement or metering device, and other known devices. Any number of components of the processor 32 may be integrated with or located remotely from the sensors 34. The processor 32 receives signals (e.g., a voltage) from each element 36 via the electrodes 38. The element 36 of each sensor 34 may be any variety of shapes including plates, disks and rings, and may be made of minerals such as tourmaline, gallium phosphate, quartz, ceramics or other materials with a known modulus of elasticity and a predetermined direction of polarization. As best shown in FIG. 4, the combined element 36 of the sensor 34 and the structure 26 has a natural longitudinal resonant frequency range 40 that generally decreases as the mass increases. The piezoelectric sensor assembly 20 may be 'tuned' to a desired resonant frequency 42 of the combined element 36 and structure 26 that is associated with a high sensor sensitivity (i.e., see peaks in FIG. 4).

Referring to FIG. 3, the piezoelectric sensor assembly 20 is generally illustrated and positioned on the structure 26. In this configuration, the assembly 20 is orientated to measure a length change of the structure in a single dimension. The symbol "$l_s$" represents the length of the element 36 of sensor 34. The symbol "$dl_s$" represents a change in the element length, and "σ" and "ε" respectively, represent stress and strain. The symbol "Z" generally represents the voltage across a given circuit model of the assembly 20.

Figure 5:
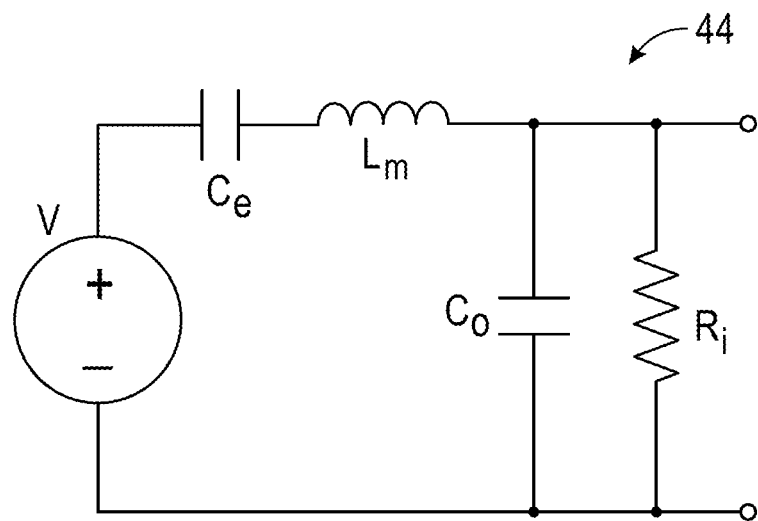
FIG. 5 is a schematic of an equivalent circuit model of the piezoelectric sensor.

Referring to FIGS. 3 and 5, when the assembly 20 is operating in the dynamic sensing mode 22 within the high frequency range 28, the piezoelectric sensing assembly 20 responds to the frequency of the load (see FIG. 2). The load frequency is generally in the high frequency range 28 that may extend from about 3 Hz to about 10 kHz.

When in the dynamic sensing mode 22, the processor 32 may condition input signals received via the electrodes 38 from the sensor elements 36 utilizing a dynamic circuit model 44. In model 44 the symbol "L" represents inductance, and "C" represents the capacitance. The strain measurement utilizing the dynamic circuit model 44 may be mathematically represented by the following equation (i.e., dynamic formula):

$$\varepsilon = (VC)/S$$

The symbol "V" is the voltage generated across the electrodes 38 of the sensor 34. The symbol "C" represents the capacitance of the sensor element 36, and the symbol "S" is a Young's modulus of the element material.

Figure 6:
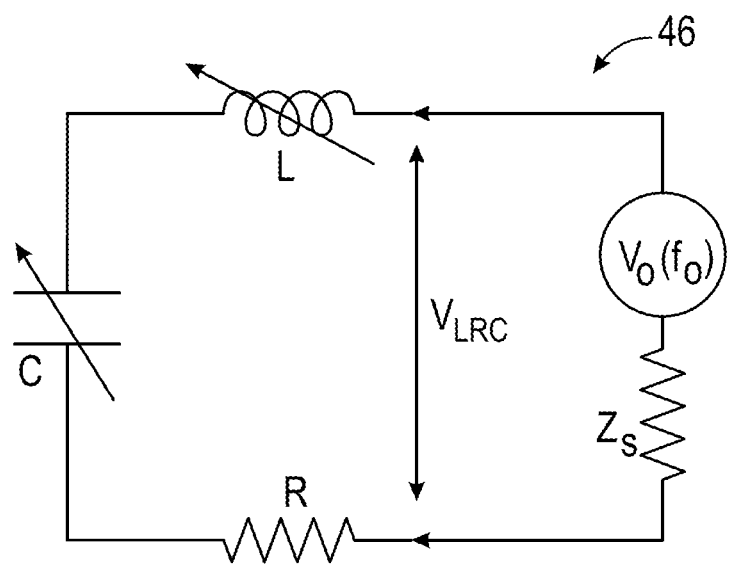
FIG. 6 is a schematic of a circuit measuring the change of resonant frequency by a voltage divider method.

Referring to FIGS. 3 and 6, when the assembly 20 is operating in the static sensing mode 24 within the low frequency range 30, the piezoelectric sensing assembly 20 generally does not respond to the frequency of the load. This unresponsiveness may be due, for example, to a finite electric input impedance of a metering device of the processor 32 that makes it a challenge to monitor steady-state or slow change charge as it discharges through the input impedance over time, and therefore disables the measurement of static loading utilizing the dynamic sensing mode 22.

Instead, the assembly 20 utilizes the static sensing mode 24 that detects a resonant frequency modulation that depends only on the level of the strain or load (i.e., electric resonance frequency modulation and demodulation). Generally, the low frequency range 30 is from about zero to about 3 Hz, and is that range where the assembly 20 is unresponsive to the frequency of the load. More specifically, the sensor element 36 is coupled to the structure 26 and the combined element and structure have a unique natural frequency (i.e. the resonant frequency). The force quantity or load (e.g., strain) placed upon the structure 26 modulates the resonant frequency linearly which may then be translated to a real-world load value. The resonant frequency and thus the change is detected (i.e., difference between unloaded resonant frequency and the loaded resonant frequency) by the measurement of its coupled electric impedance in the frequency domain.

When in the static sensing mode 24, the processor 32 may condition input signals from the sensor elements 36 utilizing algorithms associated with a static circuit model 46 (e.g., LRC circuit model). In model 46, the symbol "L" represents inductance, "$Z_s$" represents resistance of the voltage divider, "R" represents the equivalent resistance of the sensor, and "C" represents the equivalent capacitance of the sensor. The strain of the structure 26 that the piezoelectric sensor 34 resides on may be linearly represented by the change of the resonant frequency 42 (see. FIG. 4) of the static circuit model 46. The mathematical equation (i.e., static formula) for this linear representation is:

$$\varepsilon = 2l_s \sqrt{\frac{\rho_p}{E_p}} \Delta f_i^e$$

The symbol "$\rho_p$" represents the material density of the sensor. The symbol "Ep" represents the elastic modulus of the sensor. The symbol "$\Delta f_i^e$" represents the change in, or deviation from, the 'tuned' resonant frequency 42 of the combined sensor element 36 and structure 26. Because the piezoelectric sensor 34 electrically behaves like an LRC oscillator when mounted to the structure 26, the combined sensor element 36 and structure 26 constitutes a sharply tunable circuit with the unique resonant frequency 42 that may be represented by the following equation:

$$f_0 = 1/(2\pi\sqrt{LC})$$

The symbol "$f_0$" representing the resonant frequency 42 of the combined sensor element 36 and structure 26, "L" representing the static circuit model 46 inductance, and "C" representing the static circuit model 46 capacitance.

For a one dimensional plate-like element 36, the longitudinal resonant frequency 42 may be inversely proportional to the element length. The resonant frequency 42 (i.e., $f_0$) may vary (i.e., $\Delta f_0$) as the structure is loaded, extended or contracted and the mechanical strain is passed on to the element 36 of the sensor 34 in the form of:

$$\Delta f_0 = c\varepsilon_0$$

The symbol "c" representing a constant.

Utilizing both sensing modes 22, 24, the multi-functional, piezoelectric, sensing assembly 20 overcomes any deficiencies of more traditional sensors when measuring strain at low frequency. As a multi-functional structural health monitor sensor device, the assembly 20 covers strain measurement in a broad frequency band from static/quasi-static for aircraft maneuvers as one example, to medium frequency for structural dynamics, to ultrasonic frequency for directed wave non-destructive evaluation.

Figure 7:
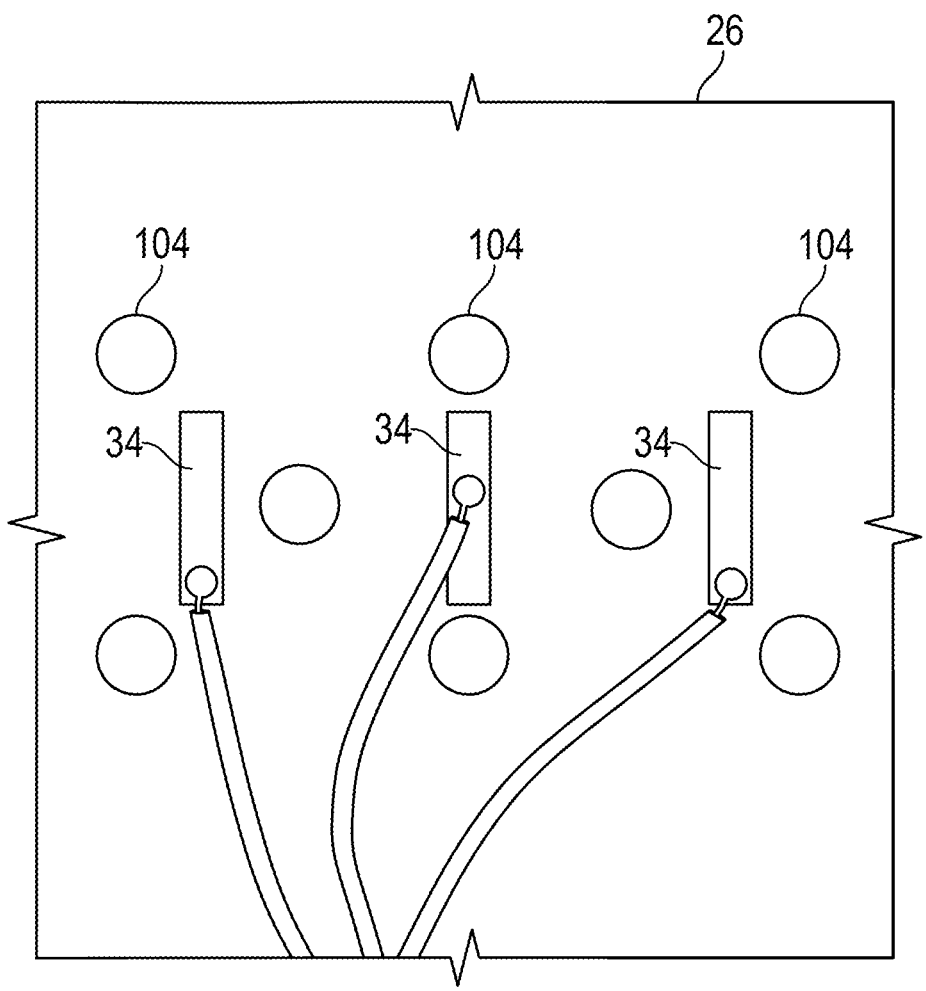
FIG. 7 is a top view of a piezoelectric sensor of the assembly secured to the structure.

Referring to FIGS. 7 and 8A, an embodiment incorporating three PZT sensors 34 on a structure 26 is shown. The sensors 34 may measure 0.5"×0.125"×0.015". The sensors 34 may be made of one or more materials, such as lead zirconium titanate, and the structure 26 may include plates (e.g., aluminum plates) measuring about 3×4.5 inches (76.2×114.3 mm) and with a plate thickness of about 0.062 inches (1.57 mm). Fasteners such as, e.g., HI-LOK® rivets 104 may be used in connection with the sensors 34 and rivet holes measuring about 0.190 inches (4.83 mm) may be used. The referenced dimensions and material types are illustrative; other dimensions and/or material types may be used in some embodiments.

Figure 9:
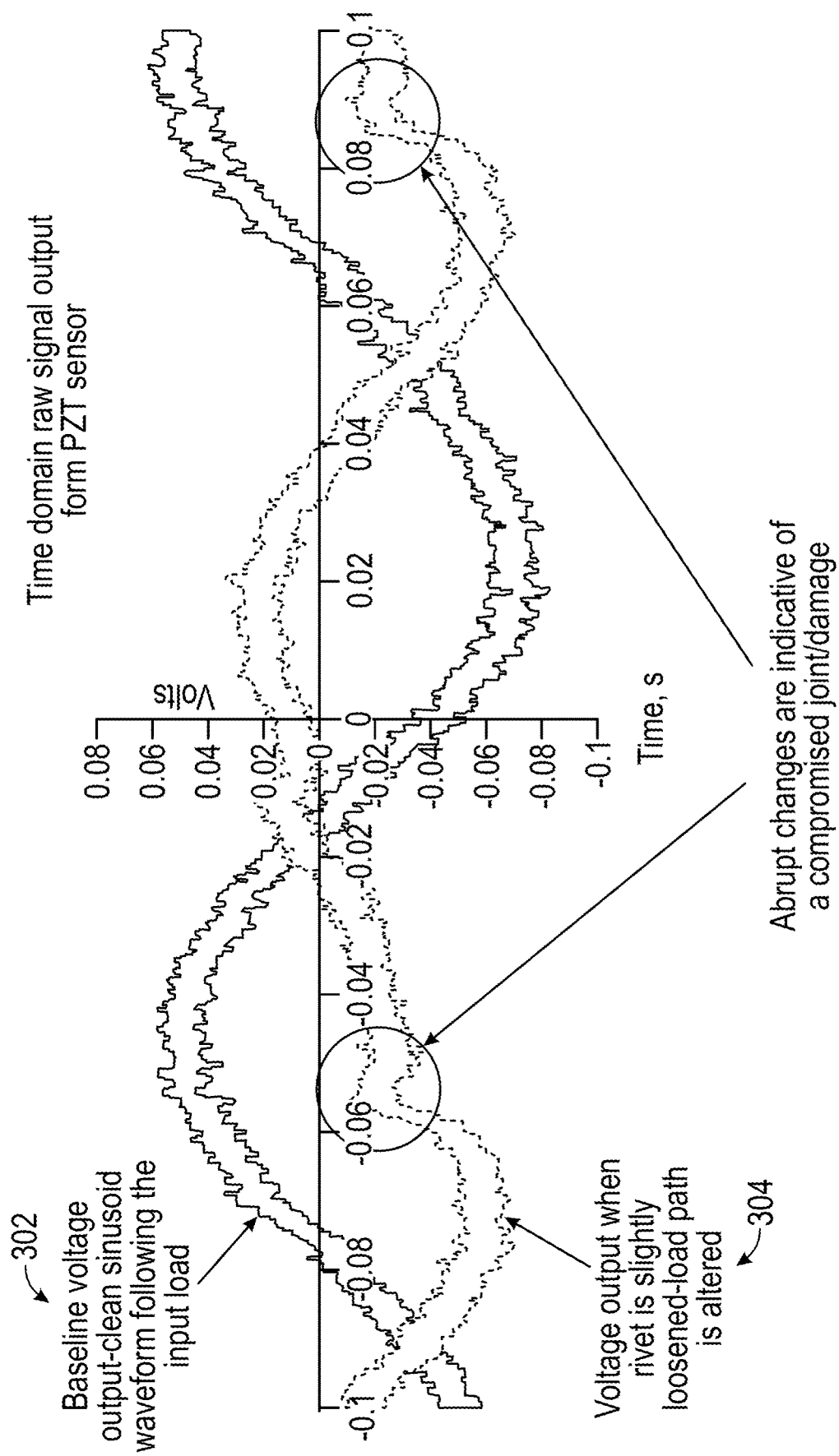
FIG. 9 is a waveform graph.

The structure or plate 26 was subject to testing with an application of 0-1000 pounds at 7 Hz and a stress of 0-5000 psi. Referring to FIG. 9, waveforms associated with the testing are shown for a given sensor 34. The waveforms may correspond to output voltage signals that are proportional to strain. A first waveform 302 is shown corresponding to a healthy condition of the joint of FIG. 1. As shown, the waveform 302 is a relatively clean and continuous sinusoid with no abrupt changes. A second waveform 304 may be indicative of when the rivet 104 associated with the sensor 34 under test is slightly loosened, resulting in an alteration of a load path. The waveform 304 has abrupt changes (e.g., changes in an amount greater than a threshold) indicative of, e.g., fretting and periodic contact, which may be symptomatic of a compromised joint or damage.

Referring to FIG. 8B, a lap-shear joint 250 in accordance with one or more embodiments is shown. The joint 250 may include one or more bolts or rivets 252, which may serve to connect one or more parts or portions of the structure 26. One or more of the joint 250 and the bolts/rivets 252 may be subject to damage or cracking, as denoted via reference character 254. The joint 250 may include one or more sensors 34. The sensors 34 may be multi-functional sensors, in the sense that the sensors 256 may be used for purposes of load path monitoring and damage detection and/or in the sense that they may operate with both dynamic and static sensing modes.

As shown in FIG. 8B, the joint 250 may be associated with a first or original load path 258 when the joint 250 and rivets 252 are free of defects (e.g., when cracking 254 is not present). The joint 250 may be associated with a second or altered load path 260 based on the damage/cracking 254 being present. The first and second load paths 258 and 260 may be different from one another, and this difference may be indicative of the existence and/or extent of the cracking 254.

Figure 8C:
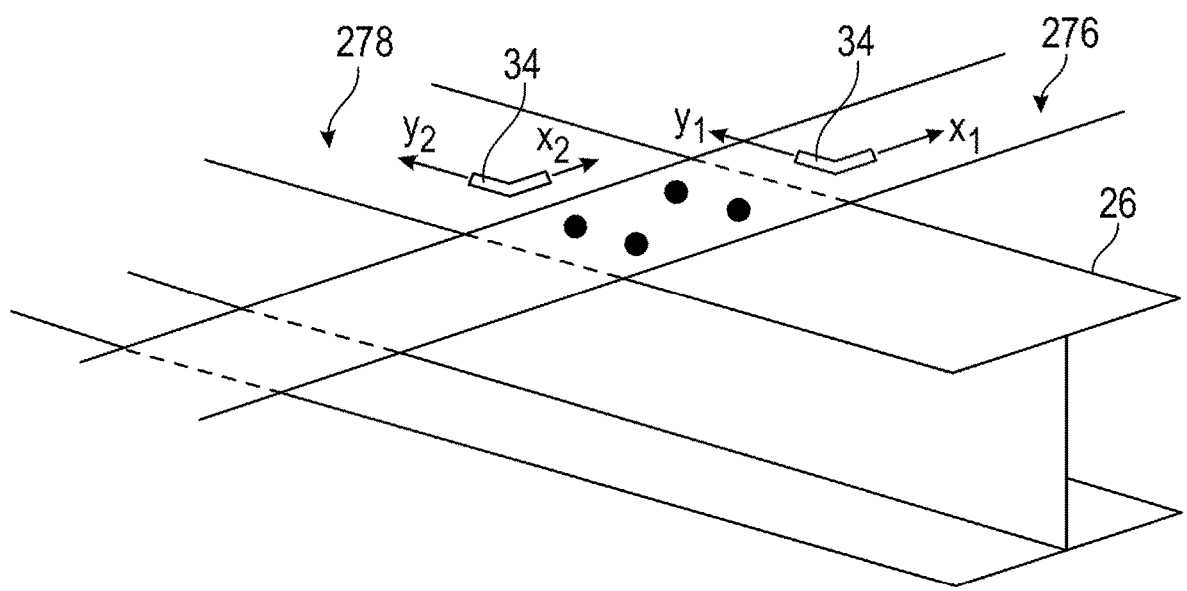
FIG. 8C is a perspective view of the structure and illustrating a second embodiment of the piezoelectric assembly.

Referring to FIG. 8C, another embodiment of structure 26 is shown. The structure 26 may be composed of one or more members, such as a first member 276 and a second member 278. One or more of the joints of the structure 26, such as a joint coupling the first member 276 and the second member 278, may be highly loaded and/or subjected to cyclic loads causing fatigue.

In some embodiments, the first member 276 may be associated with a first sensor 34 and the second member 278 may be associated with a second sensor 34. The sensors 34 may be multi-functional sensors. Based on thin PZT layers oriented along two directions (e.g., X and Y as shown in FIG. 8C; $X_1$ and $Y_1$ for one sensor 34, and $X_2$ and $Y_2$ for the other sensor 34), a voltage may be produced proportional to surface strain. The PZTs may act as strain gages in the dynamic sensing mode, which can be used for load estimation. Those same PZTs can be used for active interrogation of critical joints, potentially based on one or more high frequency excitations, in a pitch, catch, or echo mode. The PZT output may be subjected to a notch filter to identify characteristic dynamic response frequencies to improve signal-to-noise ratio (SNR). The outputs of the sensors 34 may be compared with their baseline outputs. Any differences in the outputs relative to the baseline may serve as an indication of unintended flexibility or damage within the joint. Accordingly, the PZTs may serve as both a damage sensor and a load sensor.

In some embodiments, electricity generated by a piezoelectric sensor may be stored. The stored electricity may be used as a source of power to transmit data (e.g., wireles sly transmit) or information (e.g., load data or information).

As described above, embodiments of the disclosure may be used to monitor load passing through a structure. In this respect, one or more sensors may be configured to measure load in absolute terms. The load may be expressed in one or more units (e.g., pounds).

Information or data regarding loads may be collected during various states or regimes of operation. In an example of use in connection with a rotorcraft, loads may be gathered when, e.g., the rotorcraft is on the ground, when the rotorcraft is flying in a steady-state condition (e.g., no changes being made to flight controls) or during a flight maneuver, etc.

Load information may be analyzed to determine or detect the safety of a structure. For example, load information may be analyzed to determine whether the structure has any cracks or damage.

Load information may be analyzed to determine if there is a need to inspect a structure. For example, if the load information indicates a change in an amount greater than a threshold, a targeted inspection of the structure may be scheduled. In this manner, unnecessary or excessive inspections may be minimized or eliminated.

Load information may be analyzed in connection with a lifetime associated with a structure such as, e.g., an aircraft. For example, predictive algorithms may be used to predict loads that the aircraft or structure would be subject to during operation (e.g., one or more flight regimes). If the actual loads experienced by the structure or aircraft depart from the predicted loads, the difference may serve to shorten or extend the service life of the structure or aircraft before the structure or aircraft is retired from service.

Figure 10:
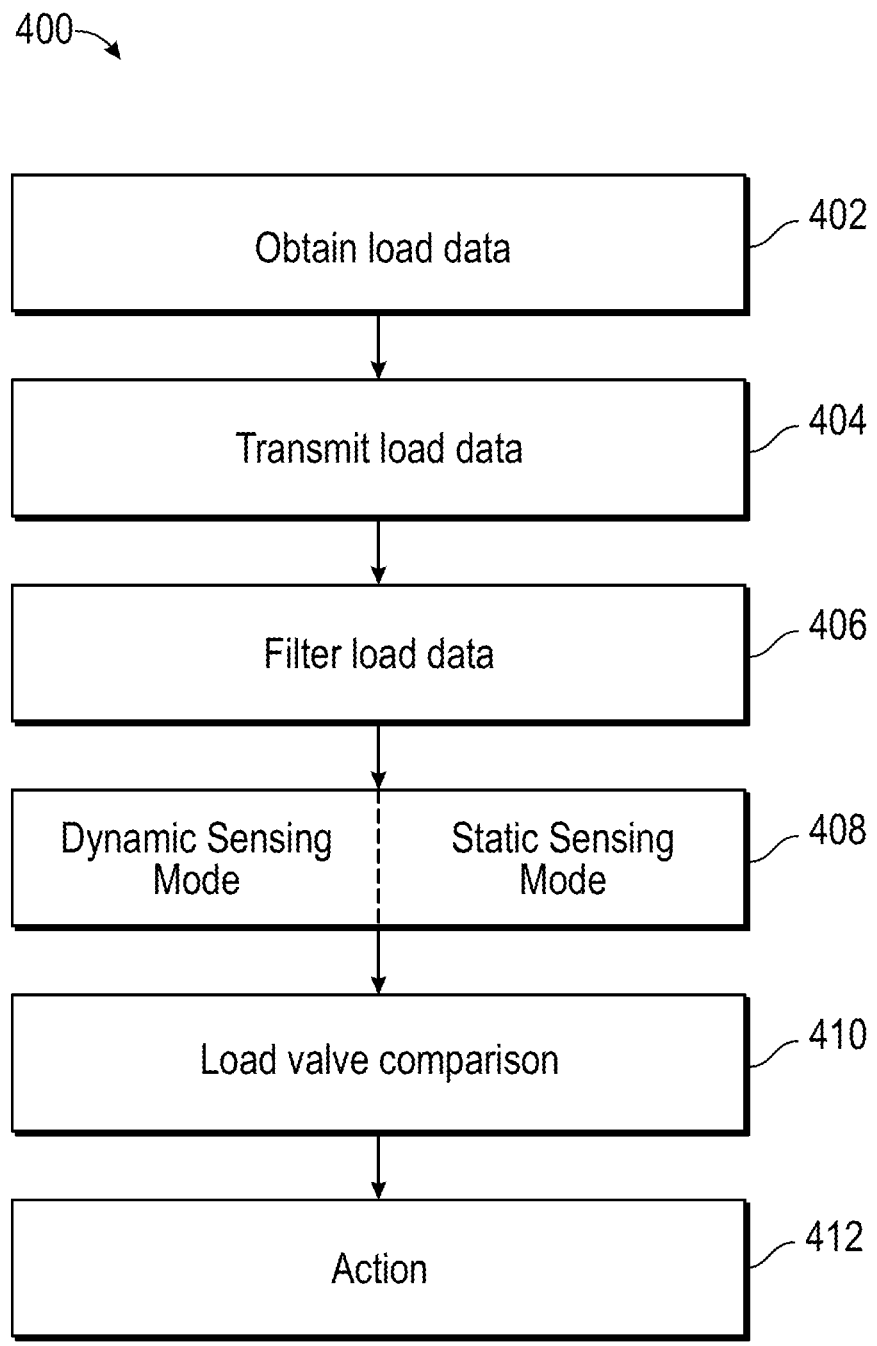
FIG. 10 is a flow chart of a method of operating the piezoelectric sensor assembly.

Turning now to FIG. 10, a flow chart of an exemplary method 400 is shown. The method 400 may be executed in connection with one or more systems, components, or devices, such as those described herein. The method 400 may be used to perform diagnostics or analyses in connection with a structure.

In block 402, load data may be obtained. The load data may be obtained from one or more piezoelectric sensors 34. This load data may include the frequency of the load upon the structure 26 and the magnitude or level of the load (e.g., acceleration, strain, etc.).

In block 404, the load data of block 402 may be transmitted. For example, the load data may be wirelessly transmitted to the processor 32 (e.g., a computing device that is external from an aircraft or other vehicle or structure). The load data may be tagged to identify a particular sensor that the load data originates from. The load data may be tagged to identify a state of a structure (e.g., a critical structure) or aircraft when the load data was taken or sampled.

In block 406, the load data may be filtered. The filtering may be performed to reduce the effect or impact of noise on a given measurement.

In block 408, the load data may be conditioned by applying the dynamic sensing mode 22 to load data falling within a high frequency range 28 and applying a static sensing mode 24 to load data not falling within the high frequency range 28 (i.e. in the low frequency range 30). After applying both modes 22, 24 by the processor 32, load values may be obtained that are indicative of the physical world.

In block 410, the load values of block 408 may be compared. The comparison of block 408 may include a comparison between load data values obtained from a first sensor and load data obtained from a second sensor. The comparison of block 410 may include a comparison between a current sample of load data and one or more prior samples of the load data in order to gauge the change in the load data over time.

In block 412, one or more actions may be taken or scheduled based on the comparison of block 410. For example, an action may be scheduled if the comparison of block 410 exceeds a threshold. As part of block 412, one or more maintenance or inspection activities may be scheduled. As part of block 412, a predicted safe lifetime associated with a structure or aircraft may be adjusted (e.g., extended or shortened). As part of block 412, the status of the health of a structure or an aircraft may be provided.

The method 400 is illustrative. In some embodiments, one or more of the blocks or operations (or a portion thereof) may be optional. In some embodiments, additional blocks or operations not shown may be included. In some embodiments, the blocks or operations may execute in an order or sequence that is different from what is shown in FIG. 10.

While the present disclosure is described with reference to exemplary embodiments, it will be understood by those skilled in the art that various changes may be made and equivalents may be substituted without departing from the spirit and scope of the present disclosure. In addition, various modifications may be applied to adapt the teachings of the present disclosure to particular situations, applications, and/or materials, without departing from the essential scope thereof. The present disclosure is thus not limited to the particular examples disclosed herein, but includes all embodiments falling within the scope of the appended claims.

What is claimed is:

1. A joint, comprising:
one or more bolts or rivets connecting one or more parts of a structure;
a piezoelectric sensor assembly for measuring a force quantity on the structure for load path monitoring and damage detection, the piezoelectric sensor assembly comprising:
at least one piezoelectric sensor, each including an element and two electrodes each projecting outward from the element; and
an electronic processor configured to receive data from the electrodes, wherein the electronic process includes a static sensing mode for measuring a static load and a dynamic sensing mode for measuring a dynamic load, wherein the data includes a voltage indicative of a load placed upon the structure, and wherein the processor is configured to process the data into a force quantity value based on a first LRC circuit model in the static sensing mode when a frequency of the load is within a first frequency range and a second LRC circuit model when the frequency of the load is within a second frequency range in the dynamic sensing mode.

2. The joint set forth in claim 1, wherein a tuned and unloaded resonant frequency, and a measured and loaded resonant frequency is associated with a combination of the sensor and the structure, and a difference between the tuned resonant frequency and the measured resonant frequency is directly proportional to the force quantity value.

3. The joint set forth in claim 1, wherein the data includes a measured resonant frequency associated with a combination of the sensor and structure that varies with the load.

4. The joint set forth in claim 1, wherein the load includes a static load having a load frequency of about less than 3 Hz.

5. The joint set forth in claim 1, wherein the processor in the dynamic sensing mode measures the dynamic load having frequency that is greater than about 3 Hz.

6. The joint set forth in claim 1, wherein the piezoelectric sensor assembly is configured to measure the force quantity in a broad load frequency range including a low frequency range associated with the force quantity measured via frequency modulation utilizing the first LRC circuit model, and a high frequency range associated with the force quantity measured via magnitude-based load monitoring utilizing the second LRC circuit model.

7. A method of load path monitoring and damage detection in a joint structure, the method comprising:
operating a piezoelectric sensor element for measuring load in the joint structure;
processing data received from a sensor element by a processor in a static sensing mode using a first LRC circuit model for loads having a low frequency range; and
processing data received from the sensor element by the processor in a dynamic sensing mode using a second LRC circuit model for loads having a high frequency range.

8. The method set forth in claim 7, wherein the static sensing mode compares changes in resonant frequency of a combination of the sensor element and the structure.

9. The method set forth in claim 7, wherein the low frequency range is from about zero to about 3 Hz, and the high frequency range is greater than about 3 Hz.

10. The method set forth in claim 7, further comprising:
establishing a baseline resonant frequency associated with a combination of the sensor element and structure without load.

11. The method set forth in claim 10 comprising:
measuring a resonant frequency associated with the combination of the sensor element and structure when loaded; and
comparing the measured resonant frequency to the baseline resonant frequency.

12. The method set forth in claim 11, wherein the changes in resonant frequency are proportional to the load.

* * * * *